United States Patent
Wahl et al.

(10) Patent No.: US 6,693,011 B2
(45) Date of Patent: Feb. 17, 2004

(54) POWER MOS ELEMENT AND METHOD FOR PRODUCING THE SAME

(75) Inventors: Uwe Wahl, Cologne (DE); Holger Vogt, Muelheim (DE)

(73) Assignee: Fraunhofer-Gesellschaft zur Foerderung der Angewandten Forschung e.V., Munich (DE)

( * ) Notice: Subject to any disclaimer, the term of this patent is extended or adjusted under 35 U.S.C. 154(b) by 0 days.

(21) Appl. No.: 10/225,022

(22) Filed: Aug. 21, 2002

(65) Prior Publication Data

US 2003/0001215 A1 Jan. 2, 2003

Related U.S. Application Data

(62) Division of application No. 09/869,902, filed as application No. PCT/EP99/00109 on Jan. 11, 1999, now Pat. No. 6,462,376.

(51) Int. Cl.[7] .............................................. H01L 21/336
(52) U.S. Cl. ........................................ 438/270; 438/271
(58) Field of Search ................................. 438/270, 271, 438/137, 138, 156, 173, 192, 206, 209, 212, 268

(56) References Cited

U.S. PATENT DOCUMENTS

| | | | | |
|---|---|---|---|---|
| 5,656,843 A | * | 8/1997 | Goodyear et al. | 257/329 |
| 5,689,128 A | * | 11/1997 | Hshieh et al. | 257/331 |
| 5,763,915 A | * | 6/1998 | Hshieh et al. | 257/330 |
| 6,124,612 A | * | 9/2000 | Tihanyi et al. | 257/330 |
| 6,265,744 B1 | * | 7/2001 | Okumura | 257/330 |

FOREIGN PATENT DOCUMENTS

JP          08097412 A  *  4/1996  ........... H01L/29/78

* cited by examiner

Primary Examiner—Eddie Lee
Assistant Examiner—Paul E Brock II
(74) Attorney, Agent, or Firm—Glenn Patent Group; Michael A. Glenn (57) ABSTRACT

A power MOS element includes a drift region with a doping of a first doping type, a channel region with a doping of a second doping type which is complementary to said first doping type and which borders on said channel region and said drift region, and a source region with a doping of said first doping type, said source region bordering on said channel region. Furthermore, said power MOS element includes a plurality of basically parallel gate trenches which extend to said drift region and which comprise an electrically conductive material which is insulated from the transistor region by an insulator. The individual gate trenches are connected by a connecting gate trench, a gate contact only being connected in an electrically conductive way to the active gate trenches via contact holes in said connecting gate trench. For producing, three photolithographic steps are sufficient, which serve to etch said gate trenches and said connecting gate trench, to produce said contact holes for said source region and said channel region as well as for said connecting gate trench, and to finally structure said gate contacts and said source contact. Thus, a flexible layout concept is possible in which said gate contact can also be placed in the middle of or at another location on said power MOS element without additional expenditure. Optionally, without additional process steps, margin terminating structures can be produced parallel to the formation of said active transistor region in the form of circumferential floating rings or of floating field plates.

18 Claims, 6 Drawing Sheets

POWER MOS ELEMENT AND METHOD FOR PRODUCING THE SAME

RELATED APPLICATIONS

This application is a divisional application of copending U.S. application Ser. No. 09/869,902 now U.S. Pat. No. 6,462,376 filed Oct. 2, 2001 which is a 371 of PCT/EP99/00109 filed Jan. 11, 1999.

FIELD OF THE INVENTION

The present invention relates to a power MOS element and to a method for producing the same and in particular to a vertical power MOS element whose gate comprises a plurality of trenches and whose source contact and gate contact are located on the front side thereof, while the drain contact is located on the rear side thereof, in such a way that the flow of current through the element is basically perpendicular to the front side and the rear side, i.e. vertical.

BACKGROUND OF THE INVENTION AND PRIOR ART

Vertical power MOSFET structures have been known for quite a time. As early as in 1985 Daisuke Ueda et al. presented a power MOS element provided with a trench gate in "New Vertical Power MOSFET Structure with Extremely Reduced On-Resistance", IEEE Transactions on Electron Devices, Vol. ED-32, No. 1, January 1985. In this structure the gate is not located laterally on the surface of the wafer but vertically on the side faces of trenches plasma etched anisotropically. The element comprises a full area rear side drain contact and an upper side source contact.

In vertical power MOS transistors of this type the proportion of the channel resistance of the overall turn-on-resistance increases with a decreasing electrical strength. To decrease the power dissipation at the transistor, the chip area has to be enlarged or the channel width of the transistor has to be increased. The trench technology provides for a significantly increased channel width per active transistor area compared to the conventional DMOS technology, since in this case only technology parameters are limiting factors, and not electric parameters as in the case of the DMOS concept.

In "A High-Performance Self-Aligned UMOSFET with a Vertical Trench Contact Structure" by S. Matsumoto et al., IEEE Trans. Electr. Dev., Vol. 41, No. 5, May 1994, a power MOS element is disclosed which, as the sequence of layers, comprises a strongly n-doped source layer, a p-doped channel layer, a weakly n-doped drift layer and a strongly n-doped substrate layer to which the rear side drain contact is attached. Trenches filled with polysilicon, which are insulated towards the top by silicon dioxide, form the gate trenches. The source contact on the upper side of the element is connected to both the source region and to the channel region via a contact hole filled with a metal, to hold both the source region and the channel region at a same potential. By simultaneously contacting the source region and the channel region using a contact hole a space-saving circuit design can be obtained. Since in the formation of the contact hole high aspect ratios form, a metalization which can be deposited conformly must be inserted to fill the contact holes without any empty spaces. Tungsten is used for this.

In "A High-Density Self-Aligned 4-Mask-Planar VDMOS Process" by D. Kinzer et al., Proc.-ISPSD 96, 20 to 23 of May 1996, Maui, USA, pages 243–247, a common method for producing power MOS transistors is illustrated. For the production four masks are usually used, the first mask serving to produce an opening in a field oxide, in which the active cells are to be accomodated. The second mask is the gate mask. The third mask serves as a contact mask, the fourth, and last, mask being the metal mask. This mask separates the source metal from the gate metal. The gate contact is made directly above the active gate over the whole gate width. If this technology is applied to power elements with trench gates, a further masking is additionally necessary to produce the gate trenches. Thus, conventionally five masks are used to produce vertical power elements with gate trenches.

While Ueda, Matsumoto and Kinzer describe vertical power MOS elements which are formed on or in a semiconductor substrate doped in a layered way, Richard K. Williams et al. describe a vertical power element with locally formed p- and n-regions for forming the channel region and the source region in "A 30-V P-channel Trench Gated DMOSFET with 900 $\mu\Omega$-cm$^2$ Specific On-Resistance at 2.7 V", Proc-ISPD 96, 20 to 23 May 1996, Maui, USA, pages 53 to 57.

A full area unmasked production of the doping regions is described in WO 93/26047. A silicon carbide power MOSFET disclosed in there includes an active region and a connecting region. The connecting region serves to increase the electrical strength of the power element towards the cutting edges of it or towards the margin of the wafer in such a way that margin breakdowns at margin surfaces do not limit the power sustaining capability. The active region includes a gate trench insulating towards the drift region, the general region and the source region, which is produced by means of a well-known ion trench etching method. After an oxidation the trench is filled with polysilicon or a metal. The gate trench is contacted via a (polysilicon) gate contact, while a source contact and a drain contact are attached to the front and rear side of the element respectively. Non-contacted trenches in the margin region are provided to form potentially "floating" field plates and field rings respectively.

WO 95/09439 describes a further silicon carbide field effect element. This element includes several gate trenches which are formed in a substrate doped in a layered way. The trenches contain polysilicon as the conductive material which is insulated by means of an insulator. The substrate contains a large area source contact on the upper side and a large area drain contact on the rear side. The gate trenches are contacted by through holes in the source contact and in the insulator which surrounds the conductive material in the gate trench. Several single FET elements are connected in parallel by contacting the conductive gate electrodes by means of a metalization insulated from the source contact, which is arranged above the source contact.

The disadvantage of these well-known power MOS elements is that, after producing the source contact, in a further masking process through holes have to be formed in the source metal contact and the underlying gate insulator to be able to contact the gate electrodes in the gate trenches. If these gate trenches are to be connected in parallel to be able to process high currents, further steps for insulating the through holes towards the gate trenches and for structuring the gate electrode which are arranged above the source electrode are necessary, whereby the method for producing becomes expensive since two metalization layers being above each another are present, which have to be insulated from each other. Furthermore, the well-known power MOS element needs further steps for contacting the channel region which is usually, as is described in Ueda, set to the same potential as the source region.

The U.S. Pat. No. 5,763,915 discloses a DMOS transistor comprising a quadratically branched gate trench in which polysilicon is located which is isolated from the circumferential semiconductor material by a gate oxide. The gate trench defines squares which establish individual transistor cells, one source contact being arranged in each square, the plurality of source contacts, together with the rear side drain contact, forming a plurality of parallel-connected individual transistors which form the DMOS transistor as a whole. The quadratically branched gate trench is connected to a connection trench via a plurality of parallel gate rotors which are also formed as a trench. The source contact is realised by a continuous metal-face above the individual transistors, the source contact being in contact with the source region via through holes by an oxide. The gate contact is connected to the connection trench which is wider than the gate trench and the gate rotors via through holes.

EP-A-0 583 023 discloses a method for producing a DMOS transistor in which six masking steps are used. The DMOS transistor includes a terminating structure with several field rings, every set of adjacent field rings being isolated by an insulation trench so that the field rings can be arranged closely to one another. The field rings and the trenches are produced in the same steps as corresponding parts of the active transistor.

SUMMARY OF THE INVENTION

It is the object of the present invention to create a flexibly designable power MOS element whose production is obtained with a minimum number of steps.

In accordance with a first aspect of the present invention, this object is achieved by a power MOS element comprising: a drift region with a doping of a first doping type; a channel region with a doping of a second doping type, said second doping type being complementary to said first doping type, and said channel region bordering on said drift region; a source region with a doping of said first doping type, said source region bordering on said channel region; a plurality of essentially parallel gate trenches spaced from one another defining an active region of said power MOS element and extending through said source region, said channel region and into said drift region, said gate trenches comprising an electrically conductive material which is electrically insulated from said source region, said channel region and said drift region by an insulator; a connecting gate trench for connecting the gate trenches in an electrically conductive way, extending through said source region, said channel region and into said drift region, said connecting gate trench comprising an electrically conductive material which is electrically insulated from said source region, said channel region and said drift region by an insulator, said connecting gate trench being a circumferential trench comprising a first connecting region, a second connecting region, a first longitudinal region and a second longitudinal region, said first connecting region connecting first ends of said plurality of gate trenches to one another, said second connecting region connecting second ends of said plurality of gate trenches to one another, and said first and said second longitudinal regions connecting said first and said second connecting regions to each other in such a way that the active region which is defined by said plurality of gate trenches is completely surrounded by said connecting gate trench; a source contact structure for contacting said source region; a channel contact structure for contacting said channel region; a gate contact for contacting said connecting gate trench, said gate contact being connected via a contact hole through said insulator of said connecting gate trench which is filled with an electrically conductive material to said electrically conductive material of said connecting gate trench.

In accordance with a second aspect of the present invention, this object is achieved by a power MOS element comprising: a drift region with a doping of a first doping type; a channel region with a doping of a second doping type, said second doping type being complementary to said first doping type, and said channel region bordering on said drift region; a source region with a doping of said first doping type, said source region bordering on said channel region; a plurality of essentially parallel gate trenches spaced from one another defining an active region of the power MOS element and extending through said source region, said channel region and into said drift region, said gate trenches comprising an electrically conductive material which is electrically insulated from said source region, said channel region and said drift region by an insulator; a connecting gate trench for connecting the gate trenches in an electrically conductive way, extending through said source region, said channel region and into said drift region, said connecting gate trench comprising an electrically conductive material which is electrically insulated from said source region, said channel region and said drift region by an insulator, said connecting gate trench comprising a circumferential section surrounding a non-active region of said power MOS element, in which there are no gate trenches, and extension sections connected in an electrically conductive way to said circumferential section, said extension sections connecting at least a part of the gate trenches to one another in an electrically conductive way; a source contact structure for contacting said source region; a channel contact structure for contacting said channel region; a gate contact for contacting said connecting gate trench, said gate contact being connected via a contact hole through said insulator of said connecting gate trench which is filled with an electrically conductive material to said electrically conductive material of said connecting gate trench.

In accordance with a third aspect of the present invention, this object is achieved by a method for producing a power MOS element, comprising the following steps: providing a substrate having a drift region with a doping of a first doping type, a channel region with a doping of a second doping type, said second doping type being complementary to said first doping type and said channel region bordering on said drift region, and a source region with a doping of said first doping type, said source region bordering on said channel region; photolithographic producing of essentially parallel gate trenches spaced from one another defining an active region of the power MOS element, and of a connecting gate trench by means of which said plurality of essentially parallel gate trenches is connectable to one another in an electrically conductive way in such a way that said gate trenches extend through said source region, said channel region and into said drift region, wherein said connecting gate trench being a circumferential trench comprising a first connecting region, a second connecting region, a first longitudinal region and a second longitudinal region, said first connecting region connecting first ends of said plurality of gate trenches to one another, said second connecting gate trench connecting second ends of said plurality of gate trenches to one another, and said first and said second longitudinal regions connecting said first and said second connecting regions to one another in such a way that the active region which is defined by said plurality of gate trenches is completely surrounded by said connecting gate trench; or wherein said connecting gate trench comprising a circumferential section surrounding a non-active region of said power MOS element, in which there are no gate trenches, and extension sections being connected to said circumferential section in an electrically conductive way, said extension sections connecting at least a part of said gate trenches to one another in an electrically conductive way; processing said gate trenches and said connecting gate trench in order to comprise a conductive material which is isolated from said source region, said channel region and said drift region by an insulator; photolithographic producing of contact holes for contacting said source region, said channel region and said connecting gate trench, said connecting gate trench being contactable via said contact holes associated to said connecting gate trench; filling said contact holes with an electrically conductive material; and photolithographic producing of said gate contact, said source contact and said channel contact.

The present invention is based on the recognition that one has to deviate from the usual contacting of the individual gate trenches in order to achieve a parallel connection of the individual transistors has to be dismissed. Instead of conventionally contacting each individual gate trench, a connecting gate trench is provided according to the invention, into which the individual gate trenches lead or which electrically connects the individual gate trenches to one another. The main function of this connecting gate trench is no longer to control a current through a channel but instead to connect the individual gate trenches to one another. This is why the width of this gate trench can be selected quite arbitrarily, which does not necessarily apply to the width of the active gate trenches since, in this case, electric parameters of the power MOS element are established. The width of the connecting gate trench is thus preferably selected to be larger to be able to produce contact holes in the connecting gate trench in a save and reliable way without the risk of high rejects. Via these contact holes a planar gate contact is connected to the connecting gate trench and thus to the active gate trenches by means of a contact hole filling to be able to apply a suitable gate potential to the vertical power MOS element.

The power MOS element as a whole according to the invention can be produced using three photolithographic steps only. No extra mask is needed for doping local p- or n-regions.

Instead a substrate with a drift region, a channel region and a source region is used, the three regions forming a layered arrangement. The first photolithographic step serves to produce a plurality of gate trenches and the connecting gate trench. Preferably a terminating structure can also be defined in the step, which either comprises several floating trenches disposed around the active region or, in analogy to a field plate structure, includes a trench section short-circuited with the source region and the drain region.

The second photolithographic step serves to produce the contact holes for contacting the source region and the channel region and for contacting the connecting gate trench. It is pointed out that the active gate trenches are not contacted externally but solely by means of the connecting gate trench. Finally the third photolithographic step serves to structure the metal contacts in such a way that a large area source contact is provided which covers substantially the whole power MOS element except for a region above the connecting gate trench where the planar gate contact is located. If special margin structures are provided, a source contact is not present via these either.

Preferably the connecting gate trench is a closed trench arranged around the active region, which contacts the active gate trenches at both ends of the same to be able to feed the gate potential at both ends of the gate trenches. This arrangement has the advantage that a termination of the active region within the cutting edge of the power MOS element is obtained at this stage already, the limitation, with drain source voltages, which are not too large, at the power MOS element, being sufficient to avoid margin breakdowns. Thus, any kind of special margin termination can be dispensed with at lower voltage classes, whereby costs can be saved, a fact which is of special importance in mass markets, such as the automobile industry or the consumer area.

The contacting of the gate trenches via an extra connecting gate trench thus enables, without additional technology steps, placing the physical gate contacts as required by the user, either at the margin of the power MOS element or in the middle of the power MOS element or in general at any place, since placing the gate contact is decoupled from the location of the active gate trenches by the connecting gate trench.

BRIEF DESCRIPTION OF THE DRAWING

Preferred embodiments of the present invention are described in detail hereinafter referring to the accompanying drawings.

DETAILED DESCRIPTION OF THE PREFERRED EMBODIMENTS

Figure 1:
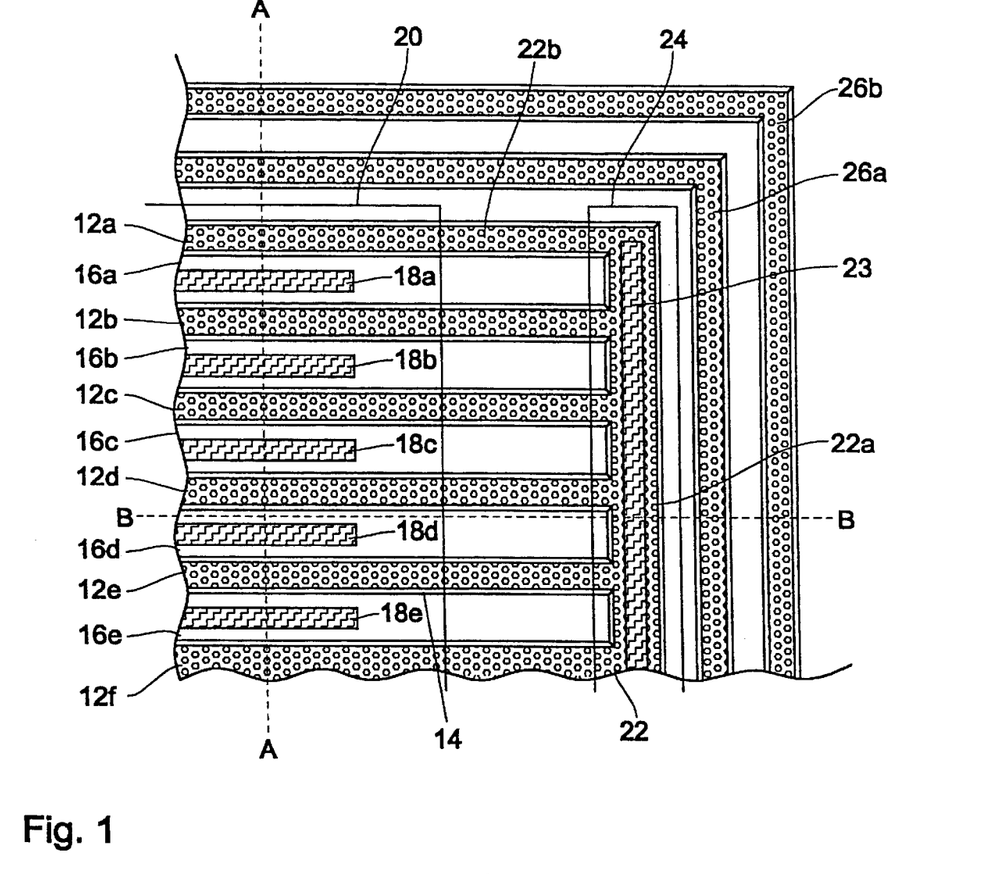
FIG. 1 is a top view of a power MOS element in which the gate contact is located at the margin of the element.

FIG. 1 shows a top view of the power MOS element according to the present invention. It is pointed out that FIG. 1 only shows a section of the power MOS element, which, for example, could be reflected at the vertical and the horizontal axis to obtain a complete, basically quadratic power MOS element, for example. As is known power MOS elements include a plurality of parallel connected individual transistors in such a way that the drain source current per individual transistor is relatively small, since the overall current into the power MOS element is divided into the different individual currents. In order to connect large currents with little dissipation only, it is important that the overall turn-on-resistance of the power MOS element is small. This is easily achieved in a parallel connection of many individual transistors, since the overall turn-on-resistance equals the parallel connection of all the individual turn-on-resistances. On the other hand the parallel connection of all the individual transistors causes the high voltage which has to be overcome by a power MOS element to be equally applied to every individual transistor, which, especially with transistors arranged at the margin of a power MOS element, i.e. near the cutting edge, can lead to breakdowns by surface effects. For this reason special precautions can be taken to prevent such a margin breakdown for higher voltage classes.

FIG. 1 shows a plurality of individual gate trenches 12a to 12f which are insulated from respective source regions 16a to 16e by an insulator 14, i.e. the gate oxide. The source regions 16a to 16e are connected, via source contact holes 18a to 18e which are filled with a conductive material, to a large area source contact 20 which, for reasons of clarification, is illustrated "transparently" in FIG. 1. The individual gate trenches 12a to 12f all lead into a connecting gate trench 22 which is connected to a gate contact 24 via contact holes which are filled with a conductive material.

As can be seen in FIG. 1, the connecting gate trench comprises a connecting region 22a and a longitudinal region 22b in such a way that the connecting gate trench surrounds the active region of the power MOS element. For smaller drain-source-voltages the termination of the active region by the connecting gate trench 22 will be sufficient to avoid margin breakdowns. For higher voltage classes a margin terminating structure can be provided which, in the embodiment of FIG. 1, includes a first margin terminating structure 26a and a second margin terminating structure 26b. As will be illustrated later alternatives for forming the margin terminating structure exist.

The power MOS element according to the invention can be produced with only three masking and lithographic steps with a minimum of process, and thus, cost expenditure. The first photolithographic step is used to produce the plurality of gate trenches 12a to 12f, the gate connecting trench 22 and the margin terminating trenches 26a, 26b. The second lithographic step is used to produce the contact holes 18a to 18e for the source region and the contact holes 23 for the gate regions. The third, and last, lithographic step is used to define the source contact 20 and the gate contact 24 as well as possible surface metal structures for the margin termination (see FIG. 6).

Figure 2:
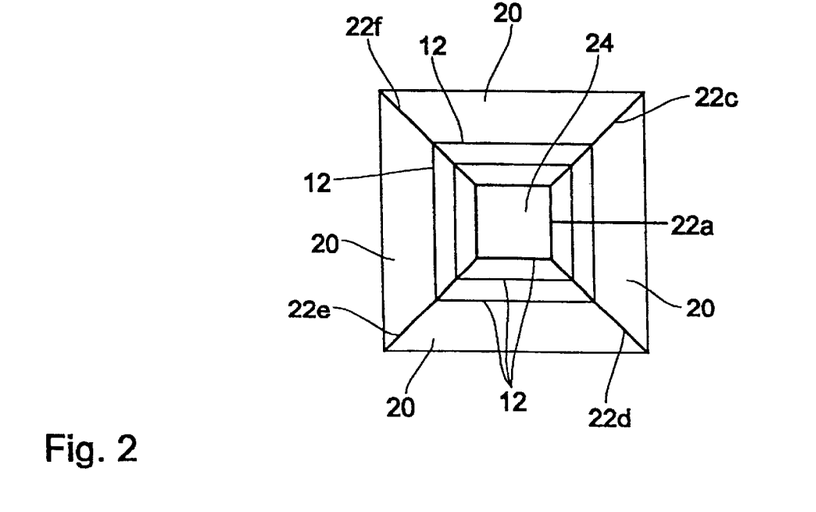
FIG. 2 is a top view of a power MOS element in which the gate contact is located in the middle of the element.

FIG. 2 is a top view of an alternative embodiment of the power MOS element in which the gate contact 24 is located in the middle of the element while the source contact 20 is arranged around the gate contact 24. The power MOS element shown in FIG. 2 further includes a plurality of gate trenches 12 which are arranged, in each quarter of the power MOS element, parallel to one another, as is shown in FIG. 2. It is noted that only a few gate trenches are illustrated. It is, however, clear that a plurality of further gate trenches, which are not shown in FIG. 2, are located under the source contact 20. The individual, basically parallel gate trenches are connected to one another by the connecting trench 22. The gate connecting trench 22 includes four extension portions 22c to 22f which all extend in a diagonal way to connect the individual active gate trenches to one another. They lead into a wider connecting region 22a of the gate connecting trench which, as is shown in FIG. 1, is connected to the gate contact 24 via contact holes (not shown in FIG. 2).

Figure 3:
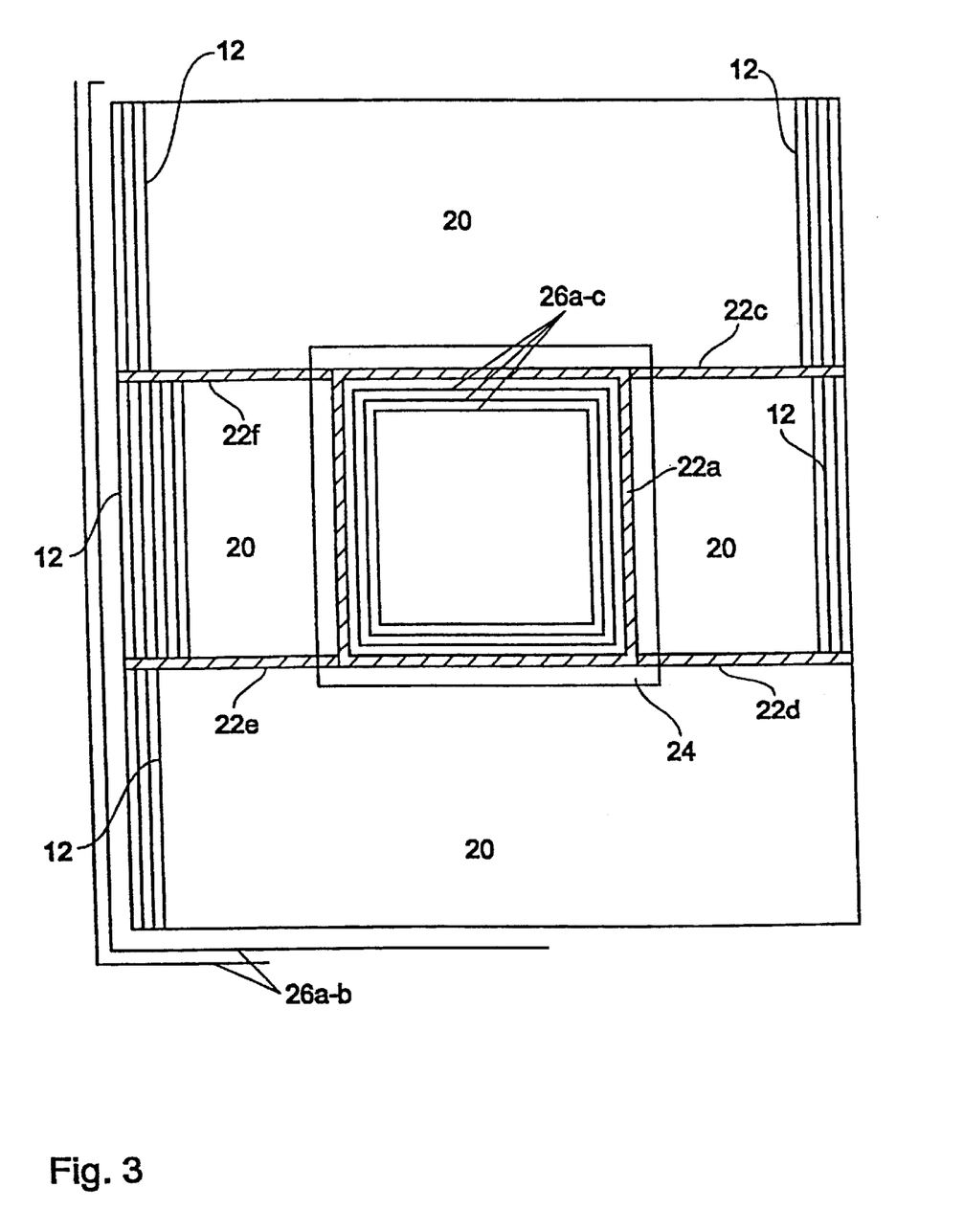
FIG. 3 is a top view of a power MOS element in which the gate contact is located in the middle of the element and in which the gate trenches are connected to the connecting gate trench in a right-angled way.

FIG. 3 is a top view of a power MOS element in which the gate contact 24 is also located in the middle. Unlike the embodiment shown in FIG. 2, the extension sections 22c to 22f of the connecting gate trench 22 do not extend in a diagonal way but parallel to one another. They are in turn connected to the connecting section 22a of the connecting gate trench above which the gate contact 24 is arranged and, by means of suitable contact holes (not shown in FIG. 3) electrically connected to the gate trenches 12 via the connecting gate trench. The embodiment shown in FIG. 3 further includes margin terminating trenches 26a, 26b around the active region and additional margin terminating trenches 26a to 26c in the middle of the active region where the gate contact 24 is formed. It is thus ensured that the whole active region of the power MOS element is secured in such a way that surface effects which may reduce the maximum applicable drain source voltage cannot occur. It is obvious from FIG. 3 that, in analogy to FIG. 1, the connecting gate trench could also be formed around the hole element in such a way that, without additional margin terminating structures, a certain margin termination which will be sufficient for smaller drain source voltages can be obtained. In this case the connecting gate trench serves to electrically connect the individual active gate trenches, i.e. to connect in parallel the individual transistors, and to provide a certain margin termination.

Figure 4A:
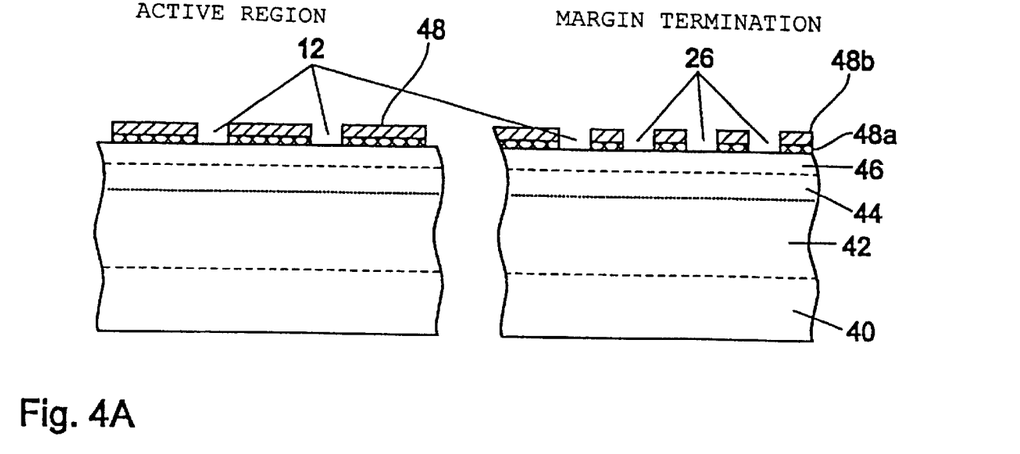
FIGS. 4A to 4D are a sequence of cross sections through the power MOS element of FIG. 1 along the line A—A of FIG. 1.
Figure 4B:
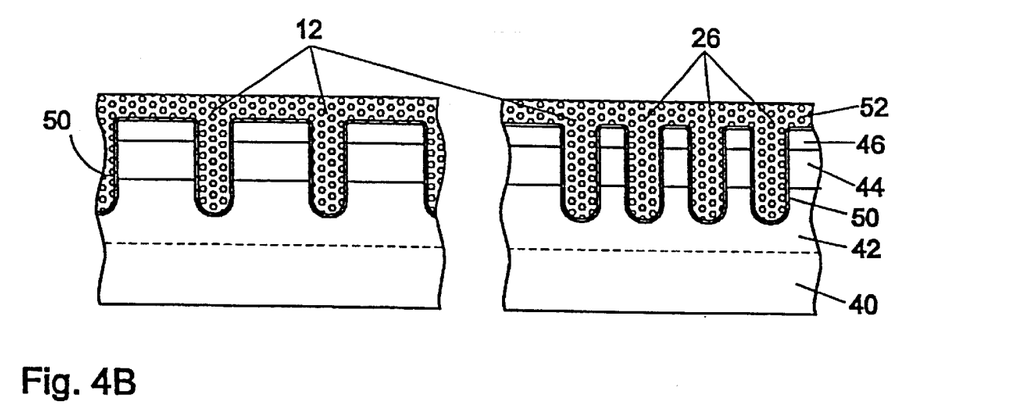

FIGS. 4A to 4D show different production steps of the power MOS element by means of a cross section along the line A—A in FIG. 1. FIG. 4A shows the power MOS element according to the invention at the beginning of its production. It contains a drain region 40 which is strongly n-doped. Next to this strongly n-doped drain region is a weakly n-doped drift region 42 on which in turn a p-doped channel region 44 is formed. A strongly n-doped source region 46 forms the surface of the semiconductor substrate onto which according to the illustration in FIG. 4A a trench etching mask 48 is already formed, which, in a preferred embodiment of the present invention, is two-layered and consists of a nitride layer 48a and an oxide layer 48b. The first mask 48 defines the gate trenches 12, the margin terminating trenches 26 and the connecting gate trench (not shown in FIG. 4).

Although NMOS transistors are described in this application, it is obvious for those skilled in the art that all the explanations of this application can also refer to PMOS transistors, wherein, in this case, only the n-dopings have to be substituted by p-dopings and vice versa.

As can be seen from FIG. 4 the dopings of the layers 42 to 46 are not produced locally by means of a special doping mask process but as a full area. In addition a layer lowly doped with phosphorus is grown on the highly doped n-substrate 40 which e.g. consists of silicon, to form the drift region. Onto this lowly doped layer a layer doped with boron can be grown epitaxially, which defines the channel region 44. Onto this p-doped layer comprising the doping necessary for the threshold voltage, a layer highly doped with arsenic or phosphorous can be grown to form the source region 46. Alternatively the layers 44 and 46 can also be produced by a full area implantation into a lowly n-doped epitaxy layer which comprises at least a thickness which corresponds to the sum of the layers 42 and 44. As is obviously known to those skilled in the art the techniques of the implantation and of the epitaxial growth can obviously be combined. If the doping profile is carried out by a combination of epitaxy and implantation, i.e. a production of the channel region 44 by means of epitaxy and production of the source region 46 by implantation, the source implantation is only carried out after the etching of the trenches and the refilling of the same, as will be explained later.

Alternatively a semiconductor substrate into which a channel region and a source region are implanted could also be used. After completing the upper side, the arrangement on the rear side could be ground back to a thickness of 20 $\mu$m to implant a region with a high doping into the rear side, onto which the rear side drain contact is finally applied. In this case not a single epitaxy step would be necessary.

All the individual implantation steps are followed by, either after each individual implantation or after the implantations directly following one another, out-diffusion steps in the oven and at a temperatures between 900° C. and 1100° C. The thickness of the epitaxy layers and the out-diffusion times of the implantations respectively determine the doping profile necessary for the respective voltage class. In the production of the doping profile with the help of implantations a so-called screening oxide with a typical thickness of 28 nm is preferably applied before.

As has already been explained, FIG. 4A shows the first mask 48 which is, depending on the trench etching process used, a resist mask or a hard mask consisting of the sequence of layers of nitride (48a) and oxide (48b). The layers of the hard mask are produced as CVD (CVD=chemical vapour deposition) or/and as an LP layer. Alternatively the hard mask could also consist of oxide only.

After etching the trenches, one or several purification oxidations follow which are removed again before a gate dielectric 50 is formed. For the gate dielectric 50 a thermal DCE oxide (DCE=dichloroethane) with a nominal thickness of 53 nm is preferred. Other layer thicknesses or a dielectric consisting of a oxide/nitride/oxide layer, as is used in a similar form in the production of DRAM, could also be used.

The trenches 12, 26, 22 (FIG. 1) are then filled with a conductive material 52. A n+ doped polysilicon can be used for this. Alternatively a combination of a thin polysilicon layer and a layer of CVD tungsten, which fills the respective trench completely is also suitable. By silicidation a very low-resistance gate terminal can be obtained, as it is necessary for fast power MOS transistors which are used in the range over 500 MHz.

Figure 4C:
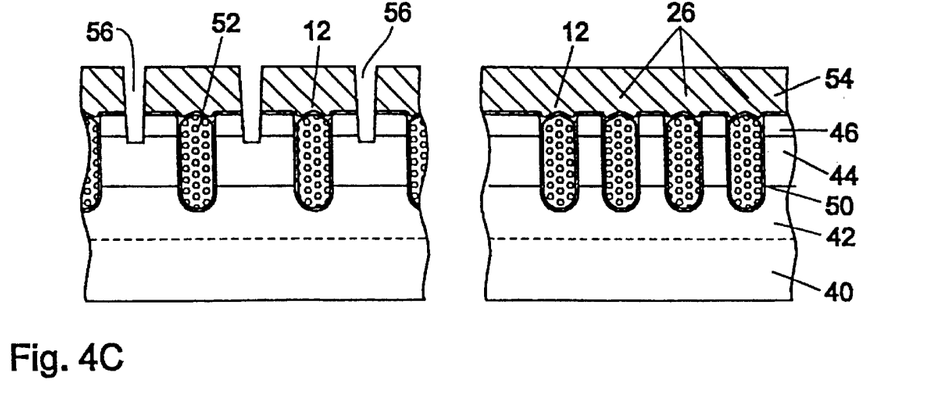
Figure 4D:
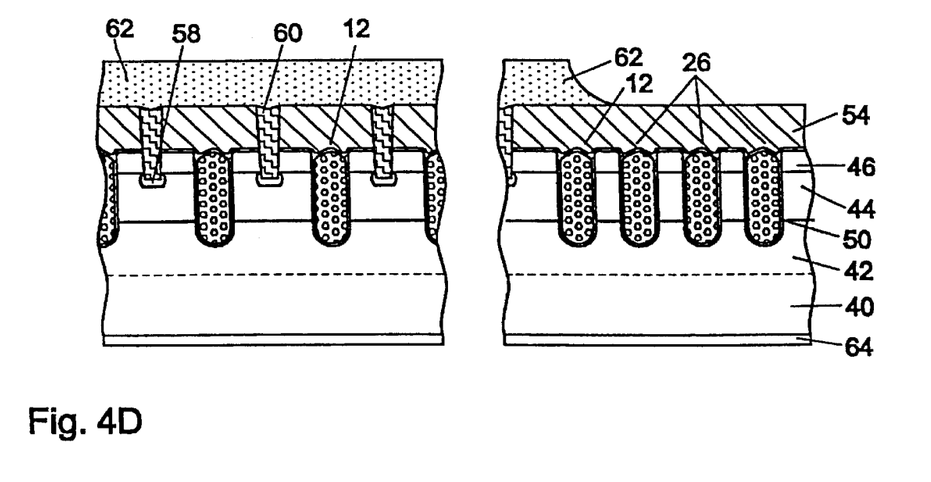

The conductive material 52 used for filling the trenches is either eroded as a full area in a plasma or wet etching process or by means of CMP (=chemical mechanical planarisation) so that the filling material of the trenches remains in the trenches as islands (see FIGS. 4C, 4D).

Alternatively, as has already been mentioned, the source implantation can be carried out. The activation of the implanted doping substances is either carried out by an additional temperature step or, if BPSG (boron phosphorus silicate glass) or silane oxide is used, as an intermediate oxide, during reflow or during tungsten-silicidation.

As is illustrated in FIG. 4C, after the removal of the excessive conductive material 52, an insulation of the trenches towards the disk surfaces is obtained by a low temperature CVD segregation of insulator layers 54. It is possible to use doped (BPSD) and undoped CVD oxide or combinations of oxide and nitride. By using such materials as the intermediate oxide 54 a final passivation can be dispensed with whereby the costs for the elements can be further reduced.

By means of a suitable mask (not shown in FIG. 4C) contact holes 56 are etched into the intermediate oxide 54, the gate insulator 50, the source region 46 and the channel region 44. For the contact hole etching the second step of the photolithographic production is used, which comprises a masking step and an etching step. Although it is not shown in FIG. 4C, it is pointed out that simultaneously with the etching of the contact holes 56 the contact holes in the connecting gate trenches (22 in FIG. 1) are formed as well. The gate contacting is thus carried out simultaneously with the source and the channel contacting. For producing the gate contacting an extra masking process or a similar process is not necessary.

When modern exposing devices are used a self adjusting process direction is not absolutely necessary since the high adjusting precision allows for sufficiently small distances between trenches and the contact. The contact is etched through the insulation layer 54 down to a depth of the silicon so that, as has already been mentioned, the source region 46 and the channel region 44 are exposed and can be contacted simultaneously.

The opened contact holes preferably form a self adjusting mask, with the resist mask deriving from the contact hole etching, which is still present on the wafer surface, for a contact hole implantation 58 (FIG. 4D) which is carried out with an implantation angle of 0° with a low energy. This contact hole implantation guarantees the robustness necessary for an industrial use by forming a low-resistance contact between the source region 46 and the channel region 44. In the FIGS. 5B and 5C further possibilities for a contact hole implantation are described. It is pointed out that the contact hole implantation and the forming of the field forming doping profile do not need any additional photo techniques and are additionally self-adjusting.

FIG. 4D shows the power MOS element in which the contact holes 56 (FIG. 4C) have already been filled. This filling of the contact holes is carried out by a metalization 60 which can be deposited conformly. For this purpose CVD tungsten is used. Alternatively CVD aluminium or "hot" aluminium can also be used. Hot aluminium is aluminium shortly before it melts. When tungsten is used, using a barrier of Ti/TiN is preferred. The metalization used contacts the channel region 44 at the bottom of the contact hole 56 and the source region 46 on the side.

Afterwards a metalization face 62 is deposited on the whole upper side of the wafer. This can either be a pure aluminium layer or, according to a preferred embodiment of the present invention, a combination of tungsten and aluminium. In the first case the full area tungsten layer must be etched back after filling the contact holes so that so-called tungsten plugs will remain in the contact holes. Onto this the aluminium layer necessary for a low-resistance current distribution and for bond connections is sputtered. In the latter case the tungsten layer is not etched back, the thick aluminium layer being sputtered additionally onto the tungsten layer. The tungsten layer serves as an inert metal in addition to the nitride layer to passivate the disk surfaces at locations where the nitride was removed.

The third and last photo technique serves to structure the metal in the margin regions of the transistor and in the gaps between the large area source terminal 20 and a gate terminal 24. After a thinning of the substrate at the rear side of the disk a suitable solderable rear side metalization, e.g. a layer system of Ti/Ni/Ag, is deposited to produce a drain contact 64.

Figure 5A:
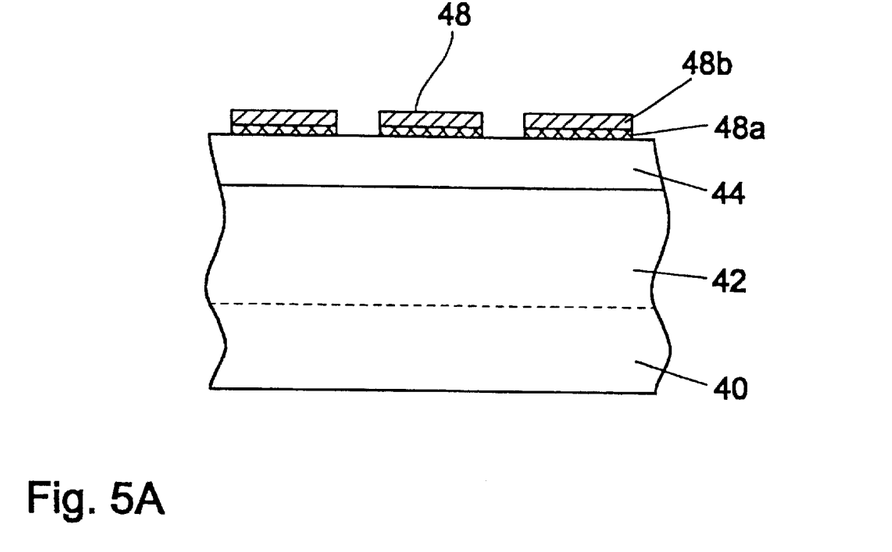
FIGS. 5A to 5C are cross sections along a line A—A of FIG. 1 of the power MOS element according to the invention during different production steps, different process variations being illustrated.
Figures 5B, 5C:
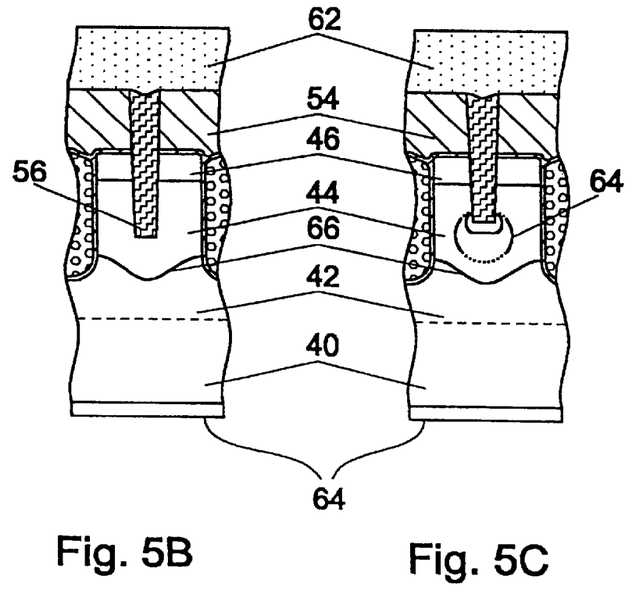

In the FIGS. 5A to 5C some process variations are illustrated. FIG. 5A shows the case in which the trenches are produced by means of the mask 48 before the source region 46 (FIG. 4A) is produced by means of implantation.

In FIG. 5B the contact hole 56 is very deep. In FIG. 5C the contact hole is not as deep, one or several additional highly energetic implantations, however, were additionally carried out in the contact hole with a subsequent out diffusion, as is shown by the reference numeral 64. Thus, a somehow wavy doping profile 66 which is illustrated in the FIGS. 5B and 5C forms, whereby a field forming feature can be obtained as is described in WO 95/09439. Thus, the robustness of the transistor is further increased. It is again pointed out that these further measures can be carried out without any additional masking steps by carrying out the contacting of the source and the channel regions through the contact holes 56.

A vertical power element with an electrical strength of above 20 volts should be limited at its edges by a specially formed margin structure. It is the purpose of this structure to decrease the electric potential in reverse bias towards the side and to form the space/charge region in such a way that early breakdowns do not occur to obtain the reverse voltage of an ideal pn-transition as far as possible. Conventional forms of a margin termination as they are especially used in high voltage elements are field rings, field plates or JTE structures (JTE=junction termination extension) which have been produced until now by local implantations with partly varying dopings in the margin region of the element. If the doping layers 42, 44, 46 are produced as a full area, it is not possible to use margin structures which are formed by local implantations. In this case, without additional precautions, the space/charge region would extend over the actual transistor to the cutting line of the individual transistor. Due to the crystal surface, which is not ideal, at the cutting line early breakdowns and leakage currents may occur at this cutting edge.

Figure 6:
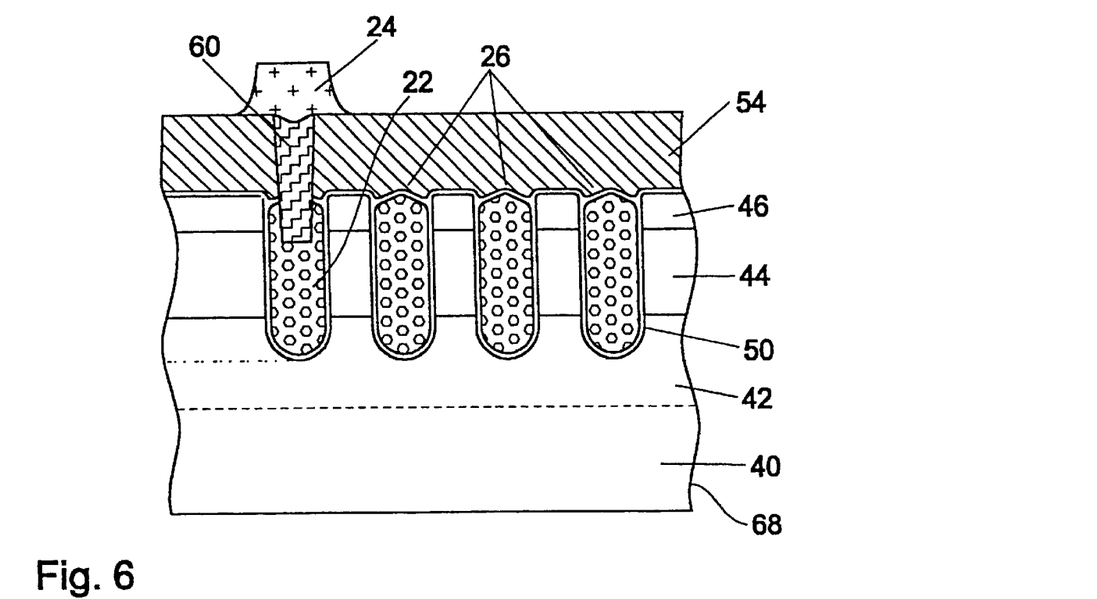
FIG. 6 is a cross section of the power MOS element of FIG. 1, along the line B—B, with a margin terminating structure in analogy to circumferential floating rings.
Figure 7:
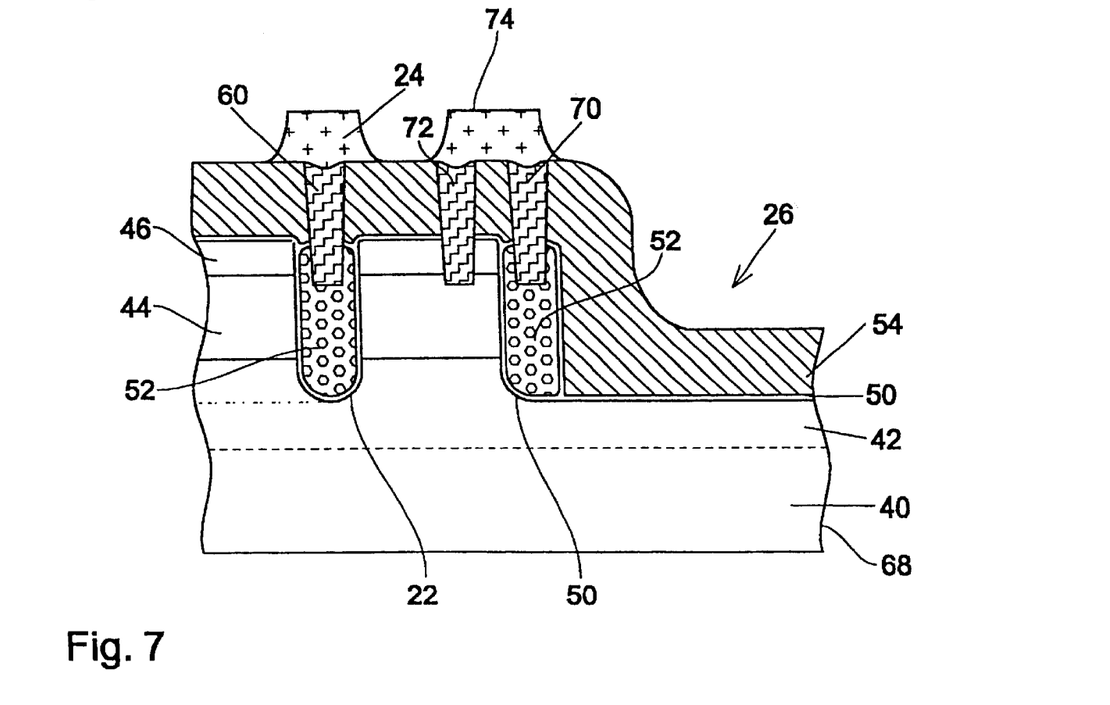
FIG. 7 is a cross section of the power MOS element of FIG. 1, along the line B—B, with a margin terminating structure in analogy to floating field plates.

To suppress such effects margin terminating structures which are a cross section through the power MOS element of FIG. 1 along a line B—B are used, as is shown in FIGS. 6 and 7. FIG. 6 shows a margin terminating structure by means of a plurality of terminating trenches 26 which operate as floating rings and are arranged along a cutting edge 68. They have a cross section increasing towards the outside since a better field forming can be achieved in this way. In FIG. 6 the contacting of the connecting gate trench 22 over a contact hole is also illustrated, which is, like the contact holes 56 (FIG. 4C), produced for the source and the channel regions by means of the same second photolithographic step. Like the contact holes 56 the contact hole is also filled with the contact hole metal 60 onto which the gate contact 24 is formed by means of the third photolithographic step. The dashed line which in FIG. 6 extends from the connecting gate trench 22 to the left is to symbolize that this is the active region of the transistor or that the essentially parallel active gate trenches extend from this point, the gate trenches being electrically connected to one another by the connecting gate trench 22.

FIG. 7 shows a further alternative of the margin termination which produces a field-plate-like effect. For orientation the connecting gate trench 22 is illustrated again in FIG. 7, which is followed, to the right in FIG. 7, by a very large terminating trench 26' of which only the left region is illustrated. This region is covered with the intermediate oxide 54 to the bottom. This is the case since in this trench 26, due to its high width, the whole polysilicon, except for the "shoulder" 52 consisting of polysilicon, has been removed in the step of etching back (in between FIG. 4B and FIG. 4C). This polysilicon is insulated towards the outside by the intermediate oxide and towards the inside by the insulator 50. It is contacted by means of an extra contact hole 70. This contact hole 70 is produced in the second photolithographic step as well as another contact hole 72. The two contact holes are connected to each other by a terminating metalization 74 in such a way that the source and the channel regions are short-circuited with the polysilicon 52 which has remained at the margin of the terminating trench 26' to produce a "field-plate-like" structure which provides a sufficient electrical strength for voltage classes over 25 volts, so that the cutting edge 68 does not negatively influence the electrical strength of the transistor.

Alternatively the polysilicon shoulder (52 in FIG. 7) of the margin terminating trench 26' could also be operated floatingly. In this case, the contact holes 70, 72 and the terminating metalization 74 are not necessary.

Basically the method for producing described for the first time enables a vertical power MOS transistor for the lower voltage region with three lithographic steps only. The limitation to three lithographic steps enables a production of the transistor with reduced costs, the process complexity being especially reduced by the decrease in the total number of process steps. Thus, costs can be avoided and the through put can be increased. A reduction of the number of process steps at the same time makes higher overall yields possible. The elements thus produced are especially suitable for the mass markets, for which costs are a critical factor, such as the automobile industry or the consumer area.

For clarification a detailed order of events for producing the transistor according to a embodiment is given hereinafter:

a) Oxidation (layer thickness: 1–100 nm, 28 nm);
b) Channel implantation (energy: 150 to 360 keV, dosis: 1E13–5E14$^{-2}$);
c) Source implantation (energy: 120–180 keV; dosis: 5E14–5E15 cm$^{-2}$);
d) 1st phototechnique: masking for the trench etching process (hard mask: CVD oxide or a combination of nitride and CVD oxide);
e) Etching trenches with a suitable depth (depth: 1–10 $\mu$m, 2.5 $\mu$m);
f) Purification oxidation (temperature: approx. 1080° C., composition: dry);
g) Removal of the purification oxide;
h) If necessary, second purification oxidation;
i) If necessary, removal of the second purification oxide;
j) Gate oxidation (thickness: 28–120 nm);
k) Filling the trenches with doped polysilicon or in two or several layers with a subsequent POCL$_3$ coating or with tungsten onto a thin polysilicon layer and subsequent silicidation;
l) Full area etching back of the polysilicon (tungsten) or eroding with CMP (CMP=chemical mechanical planarisation);
m) Segregation of an intermediate oxide;
n) 2nd phototechnique: structuring the contact holes;
o) Etching the contact holes to a suitable depth (simultaneous contacting of source and channel);
p) If necessary, contact hole implantation for improving the contact and for forming the avalanche protection structure;
q) Annealing and out-diffusing the implantation (temperature: 900–1100° C., time: 10 sec–30 min);
r) Depositing a barrier (titanium/titanium nitride (Ti/TiNi); thickness: 50–150 nm);
s) Filling the contact holes with tungsten;
t) Full area etching back the tungsten (a) or optionally leave tungsten as the conductive layer (b);
u) Depositing a thick aluminium or copper metalization; this can be omitted if, according to step (t), alternative (b), tungsten hasn't been etched back;
v) 3rd Phototechnique: structuring the metalization;

w) Wet or plasma structuring the aluminium;

x) If necessary, grinding back the wafers; and y) Depositing a solderable rear side metalization.

The method for producing according to the invention provides the following advantages:

As has already been mentioned, the method for producing is limited to three masks only.

Furthermore, the source/channel region is effected simultaneously with the contacting of the connecting gate trenches.

Furthermore, the gate contacting is carried out via a contact hole (long whole) which is adjusted to a special trench, i.e. the connecting gate trench, and etched in the same process step as the contact holes used for the source and channel contacting. Preferably the connecting gate trench is selected to be slightly wider than the active gate trenches to obtain a secure positioning of the contact hole for the gate contacting.

Furthermore it can be achieved that the active gate trenches lead into the gate connecting trench with a suitable angle. In the embodiment shown in the FIGS. 1 and 3 this angle is 90°. In the embodiment shown in FIG. 2 this acute angle is 45°.

Alternatively the active gate trenches could be modified before they meet the gate connecting trench so that they again meet the gate connecting trench with an angle of 90°. This modification would be an insertion of bending or curving into the active gate trenches. The angle of 90° has the advantage that, in a certain sense, no acute angle occurs.

The formation of the margin termination of the transistor is carried out parallel to the formation of the active trenches, the connecting gate trench and the contact holes. The margin termination can either consist of a field-plate-like construction or of one or several circumferential trenches with spacings adapted to the reverse voltage class. This can be obtained without the usage of an additional mask for the margin termination.

Furthermore, a final passivation can be dispensed with since a passivation has already been achieved by the tungsten layer on the intermediate oxide since an intermediate oxide is used as a layer system of oxide and nitride, since a passivation can be used by a Ti/TiN barrier, and since an intermediate oxide of compacted silane oxide which has an extraordinary passivating effect can be inserted. In addition, a self-adjusting contact hole implantation is realized since the mask for the contact hole etching and the etched intermediate oxide serve as the masking for a contact hole implantation.

Without any additional lithographic step a robust transistor concept with a high avalanche resistance is obtained by producing the margin terminating structure without an additional lithographic step parallel to the formation of the active region.

Finally, local p- or n-doped regions can be dispensed with since the necessary dopant profile is cheap and simply produced either by a full area implantation and/or by epitaxy layers.

A typical embodiment of the present invention has the following dimensions:

| Structure | Dimensions ($\mu$m) |
| --- | --- |
| Transistor | 1000*1000–55000*55000 |
| Trench width | 0.4–0.8 |
| Cell pitch (repeating measure) | 1.8–3.0 |
| Contact hole | 0.4–0.8 |
| Wide trenches (margin structure) | 2–10 |
| Distance floating trenches | 0.4–0.8 |
| Trench depth | 1.5–3.5 |

What is claimed is:

1. Method for producing a power MOS element, comprising the following steps:

providing a substrate having a drift region with a doping of a first doping type, a channel region with a doping of a second doping type, said second doping type being complementary to said first doping type and said channel region bordering on said drift region, and a source region with a doping of said first doping type, said source region bordering on said channel region;

photolithographic producing of essentially parallel gate trenches spaced from one another defining an active region of the power MOS element, and of a connecting gate trench by means of which said plurality of essentially parallel gate trenches is connectable to one another in an electrically conductive way in such a way that said gate trenches extend through said source region, said channel region and into said drift region, wherein said connecting gate trench being a circumferential trench comprising a first connecting region, a second connecting region, a first longitudinal region and a second longitudinal region, said first connecting region connecting first ends of said plurality of gate trenches to one another, said second connecting gate trench connecting second ends of said plurality of gate trenches to one another, and said first and said second longitudinal regions connecting said first and said second connecting regions to one another in such a way that the active region which is defined by said plurality of gate trenches is completely surrounded by said connecting gate trench; or wherein said connecting gate trench comprising a circumferential section surrounding a non-active region of said power MOS element, in which there are no gate trenches, and extension sections being connected to said circumferential section in an electrically conductive way, said extension sections connecting at least a part of said gate trenches to one another in an electrically conductive way;

processing said gate trenches and said connecting gate trench in order to comprise a conductive material which is isolated from said source region, said channel region and said drift region by an insulator;

photolithographic producing of contact holes for contacting said source region, said channel region and said connecting gate trench, said connecting gate trench being contactable via said contact holes associated to said connecting gate trench;

filling said contact holes with an electrically conductive material; and photolithographic producing of said gate contact, said source contact and said channel contact.

2. Method according to claim 1 wherein the steps of photolithographic producing each comprise a step of producing a mask and a step of etching to a specific depth.

3. Method according to claim 1 wherein the step of providing comprises the following steps:
   implanting a channel region into a semiconductor substrate which is doped with said first doping type; and
   implanting said source region into said semiconductor substrate.

4. Method according to claim 1 wherein the step of is providing a substrate comprises the following steps:
   epitaxial growing of said channel region onto a semiconductor substrate;
   implanting said source region into said epitaxially grown channel region.

5. Method according to claim 1 wherein, after the step of the photolithographic producing of said gate trenches and said connecting gate trench, at least one purification oxidation with subsequent removal of said purification oxide is carried out.

6. Method according to claim 1 wherein the step of processing said gate trenches and said connecting gate trench comprises the following steps:
   carrying out a gate oxidation to produce said insulator;
   filling said oxidized trenches with said conductive material;
   removing conductive material in such a way that only said conductive material remains in said trenches; and
   depositing an intermediate oxide.

7. Method according to claim 6 wherein said intermediate oxide comprises doped or undoped CVC-oxides, such as boron phosphorus silicate glass or silane oxide or combinations of oxide and nitride.

8. Method according to claim 1 wherein, in the step of photolithographic producing and of processing said gate trenches and said connecting gate trench, at least one terminating trench is produced which surrounds an active region of said power MOS element, the active region being established by said plurality of gate trenches and said connecting gate trench.

9. Method according to claim 1 wherein, after the photolithographic producing of said contact holes, a contact hole implantation is carried out to enable a low-resistance contact to said channel region.

10. Method according to claim 1 wherein, after the step of the photolithographic producing of said contact holes, a further contact hole implantation is carried out to modify the doping profile of said channel region and said drift region.

11. Method according to claim 1 wherein said contact holes are filled with a conductive material, whereby said source region and said channel region are short-circuited and said connecting gate trench is contacted.

12. Method according to claim 1 wherein, prior to the photolithographic producing of said gate contact, said source and said channel contacts, a full area metal layer comprising tungsten, aluminium or a combination of tungsten and aluminium is deposited.

13. Method according to claim 1 wherein, in the step of the photolithographic producing of said gate contact, said source contact and said channel contact, a source contact is produced which essentially extends over the whole surface of said power MOS element, except for a region around said connecting gate in which said gate contact is located.

14. Method according to claim 8 wherein, in the step of the photolithographic producing and processing of said gate trenches and said connecting gate trench, a plurality of terminating trenches which are not contacted and whose mutual distance increases towards the margin of said power MOS element is formed.

15. Method according to claim 8 wherein said terminating trench has a width which is 5 to 25 times as big as the width of a gate trench, and wherein, in the step of the photolithographic producing of said contact holes, a contact hole is produced in said source region and said channel region next to said terminating trench and in an electrically conductive material at the margin of said terminating trench, and wherein, in the step of the photolithographic producing of said gate contacts, said source contact and said channel contact, a metallic connection between said contact hole in said terminating trench and said contact hole in said source region and said channel region is produced to produce a field-plate-like structure.

16. Method according to claim 13 wherein said connecting gate trench, said source contact and said gate contact are arranged in such a way that said gate contact is essentially located in the middle of said power MOS element.

17. Method according to claim 1 wherein the step of processing said gate trenches comprises the following substeps:
   producing a gate oxide in said gate trenches;
   depositing a layer of polysilicon onto said gate oxide;
   depositing tungsten onto said polysilicon;
   thermal treating of said arrangement in such a way that a silicidation takes place.

18. Method according to claim 1
   wherein the step of providing comprises the following steps:
      implanting a channel region into a semiconductor substrate which is doped with a first doping type; and
      implanting said source region into said semiconductor substrate;
   and which, after the step of the photolithographic producing of said gate contact, said source contact and said channel contact, further comprises the following steps:
      grinding back said semiconductor substrate on that side which is opposite to the side in which said gate trenches are formed;
      implanting a highly doped region into said semiconductor substrate from that side which is ground back; and
      depositing a rear side metalization to produce a drain contact.

* * * * *